(12) United States Patent
Lin et al.

(10) Patent No.: US 10,573,830 B2
(45) Date of Patent: Feb. 25, 2020

(54) FLEXIBLE DISPLAY PANEL AND METHOD OF FABRICATING FLEXIBLE DISPLAY PANEL

(71) Applicant: AU OPTRONICS CORP., Hsin-Chu (TW)

(72) Inventors: Po-Yang Lin, Hsin-Chu (TW); Tsung-Ying Ke, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 349 days.

(21) Appl. No.: 15/624,817

(22) Filed: Jun. 16, 2017

(65) Prior Publication Data

US 2017/0294611 A1   Oct. 12, 2017

Related U.S. Application Data

(62) Division of application No. 14/333,518, filed on Jul. 17, 2014, now abandoned.

(30) Foreign Application Priority Data

Jan. 10, 2014 (TW) .............................. 103101066 A

(51) Int. Cl.
*H01L 51/00* (2006.01)
*B32B 43/00* (2006.01)
(Continued)

(52) U.S. Cl.
CPC .......... *H01L 51/0097* (2013.01); *B32B 38/10* (2013.01); *B32B 43/003* (2013.01);
(Continued)

(58) Field of Classification Search
CPC ............ G02F 1/133305; G02F 1/1333; H01L 51/0097; B32B 43/006; B32B 38/10; B32B 43/003; B32B 38/04
(Continued)

(56) References Cited

U.S. PATENT DOCUMENTS 8,110,442 B2   2/2012   Jinbo
2007/0009813 A1   1/2007   Fujita
(Continued)

FOREIGN PATENT DOCUMENTS

CN   103236418   8/2013
JP   05142414 A * 6/1993
(Continued)

OTHER PUBLICATIONS

JPO English abstract of JP05142414, Jun. 1993.*
Derwent English abstract of JP05142414, Jun. 1993.*

*Primary Examiner* — Philip C Tucker
*Assistant Examiner* — Jimmy R Smith, Jr.
(74) *Attorney, Agent, or Firm* — WPAT, PC

(57) ABSTRACT

A flexible display panel has an active region and a peripheral region surrounding the active region. The flexible display panel includes a barrier layer, a flexible layer, a display device array and a driving IC. The barrier layer has a first opening. The flexible layer is disposed on the barrier layer, and filled into the first opening of the barrier layer. The display device array is disposed on the flexible layer and located in the active region. The driving IC is disposed on the flexible layer, electrically connected to the display device array and corresponding to the first opening of the barrier layer.

19 Claims, 11 Drawing Sheets

(51) Int. Cl.
*B32B 38/10* (2006.01)
*H01L 51/52* (2006.01)
*H01L 51/56* (2006.01)
*G02F 1/1333* (2006.01)
*G02F 1/1345* (2006.01)

(52) U.S. Cl.
CPC .......... *B32B 43/006* (2013.01); *G02F 1/1333* (2013.01); *G02F 1/13454* (2013.01); *G02F 1/133305* (2013.01); *H01L 51/5259* (2013.01); *H01L 51/56* (2013.01); *G02F 2001/133354* (2013.01); *Y10T 29/4913* (2015.01)

(58) Field of Classification Search
USPC .................................................. 156/247, 248
See application file for complete search history.

(56) References Cited

U.S. PATENT DOCUMENTS

| | | | |
|---|---|---|---|
| 2008/0003727 A1* | 1/2008 | Jinbo | H01L 27/1266 438/149 |
| 2010/0068483 A1 | 3/2010 | Leu et al. | |
| 2010/0202076 A1* | 8/2010 | Liu | G02B 5/201 359/891 |
| 2011/0134372 A1* | 6/2011 | Lee | G02F 1/1334 349/88 |
| 2011/0318544 A1 | 12/2011 | Chen et al. | |

FOREIGN PATENT DOCUMENTS

| | | |
|---|---|---|
| TW | 200809970 | 2/2008 |
| TW | 201030692 | 8/2010 |
| TW | 201102696 | 1/2011 |

\* cited by examiner

(12) United States Patent
US 10,573,830 B2

FLEXIBLE DISPLAY PANEL AND METHOD OF FABRICATING FLEXIBLE DISPLAY PANEL

BACKGROUND OF THE INVENTION

1. Field of the Invention

The present invention relates to a flexible display panel and method of fabricating the same, and more particularly, to a flexible display panel having a plurality of regions of different debonding forces and method of fabricating the same.

2. Description of the Prior Art

Flexible display panel is characterized by its light weight, impact resistance and flexibility, and therefore is expected to be a mainstream in next generation display device.

In a conventional flexible display panel, the display devices and the switching devices are formed on top of a thin film with flexibility e.g. a plastic thin film. The plastic thin film alone is not firm enough to be a substrate for supporting the display devices and the switching devices, and thus must be adhered to a carrier substrate e.g. a glass substrate before the display devices and the switching devices are formed on the plastic thin film. After the display devices and the switching devices are formed, the plastic thin film is released from the carrier substrate. The display devices and the switching devices, however, tend to be damaged during the course of releasing the plastic thin film from the carrier substrate, which reduces the yield of flexible display panel and impedes the development of flexible display panel.

SUMMARY OF THE INVENTION

It is therefore one of the objectives of the present invention to provide a flexible display panel and method of fabricating the same to increase the yield of flexible display panel.

According to an embodiment of the present invention, a flexible display panel is provided. The flexible display panel has an active region and a peripheral region surrounding the active region. The flexible display panel comprises a barrier layer, a flexible layer, a display device array and a driving IC. The barrier layer has a first opening. The flexible layer is disposed on the barrier layer, wherein the flexible layer is filled into the first opening of the barrier layer. The display device array is disposed on the flexible layer and located in the active region. The driving IC is disposed on the flexible layer, wherein the driving IC is electrically connected to the display device array, and the driving IC is corresponding to the first opening of the barrier layer.

According to another embodiment of the present invention, a method of fabricating flexible display panel is provided. The method comprises the following steps. A carrier substrate is provided. The carrier substrate has at least one chip panel region, the at least one chip panel region has an active region and a peripheral region, and the peripheral region surrounds the active region. The first organic layer is formed on a surface of the carrier substrate. A release layer is formed on a surface of the first organic layer, wherein the release layer has at least one first opening, and the at least one first opening exposes a portion of the surface of the first organic layer in the peripheral region of the at least one chip panel region. A second organic layer is formed on a surface of the release layer, wherein the release layer and the first organic layer have a first interface, the second organic layer and the portion of the surface of the first organic layer exposed by the at least one first opening of the release layer have a second interface, and a debonding force of the first interface is greater than a debonding force of the second interface. At least one display device array is formed on the second organic layer, wherein the at least one display device array is disposed in the active region of the at least one chip panel region. A cutting process is performed to cut the second organic layer and the release layer in the peripheral region of the at least one chip panel region to separate the second organic layer and the release layer in the at least one chip panel region from the surface of the first organic layer to format least one flexible display panel.

The flexible display panel and the fabrication method thereof create a plurality of regions with different debonding forces, which provides sufficient adhesion between the flexible display panel and the carrier substrate and also prevents the driving IC and the conductive line from being damaged due to excessive debonding force.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be made in detail. The preferred embodiments of the present invention are illustrated in the accompanying drawings with numbered elements.

Figure 1:
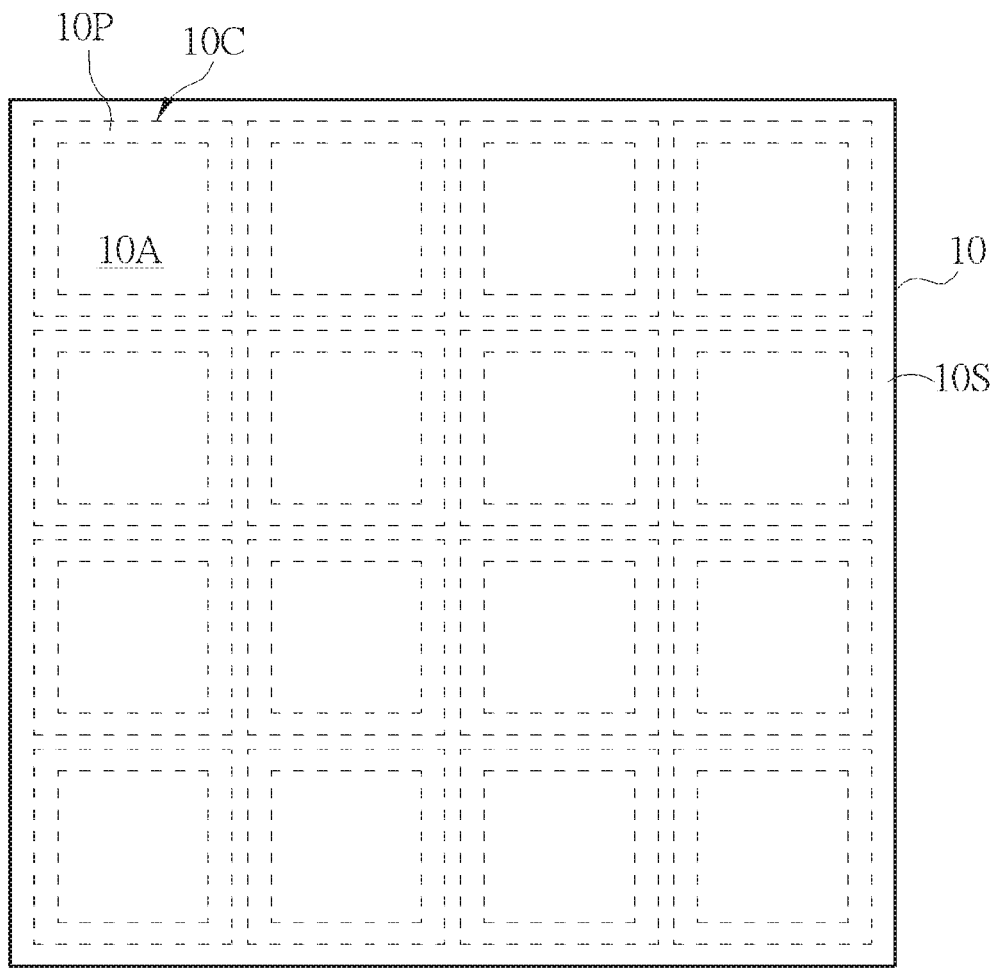
FIGS. 1-9 are schematic diagram illustrating a method of fabricating flexible display panel according to an embodiment of the present invention.
Figure 2:
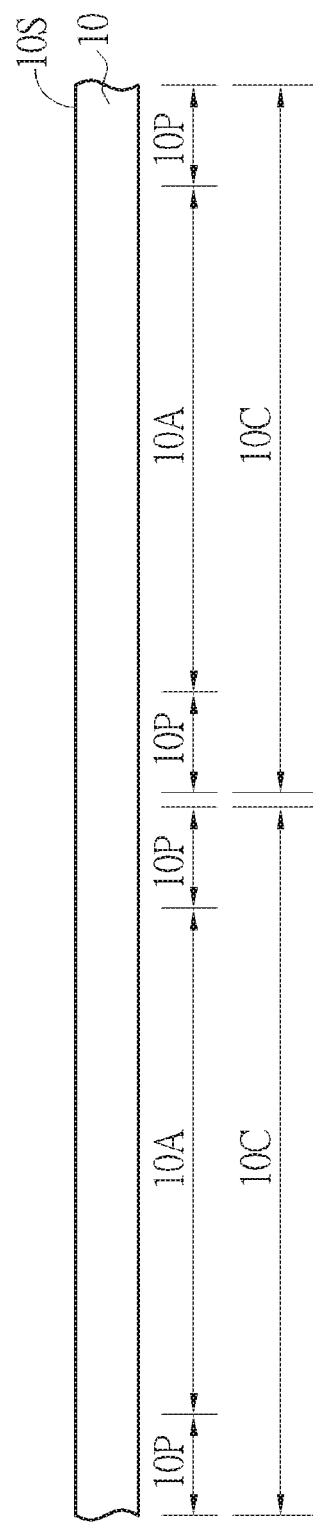
Figure 5:
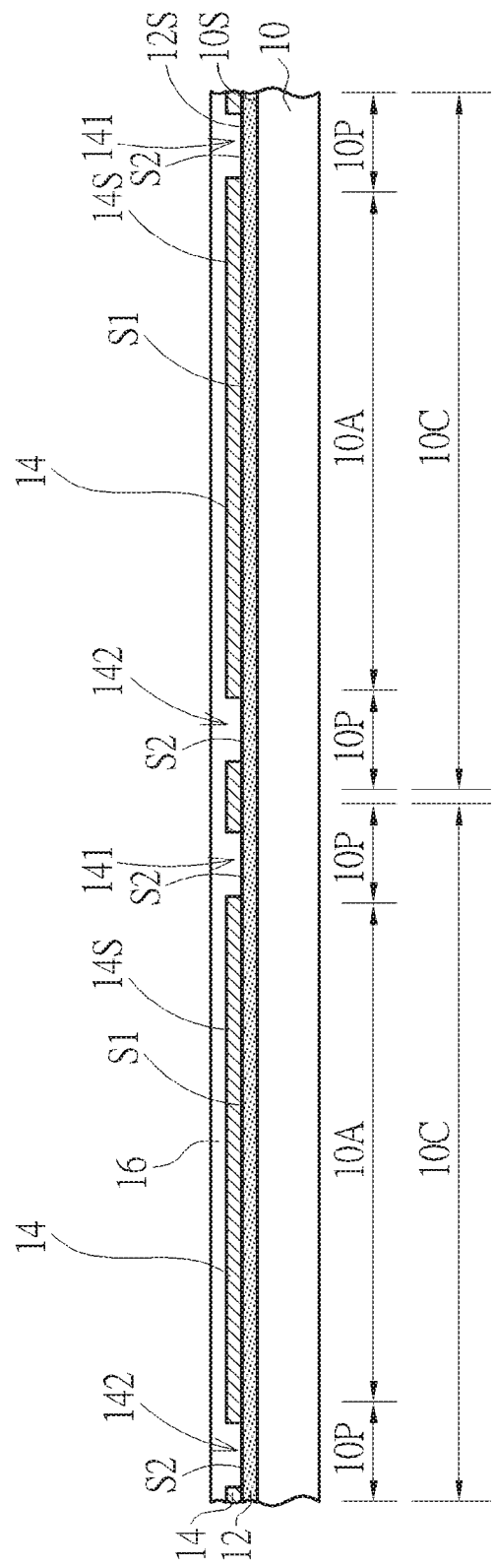
Figure 6:
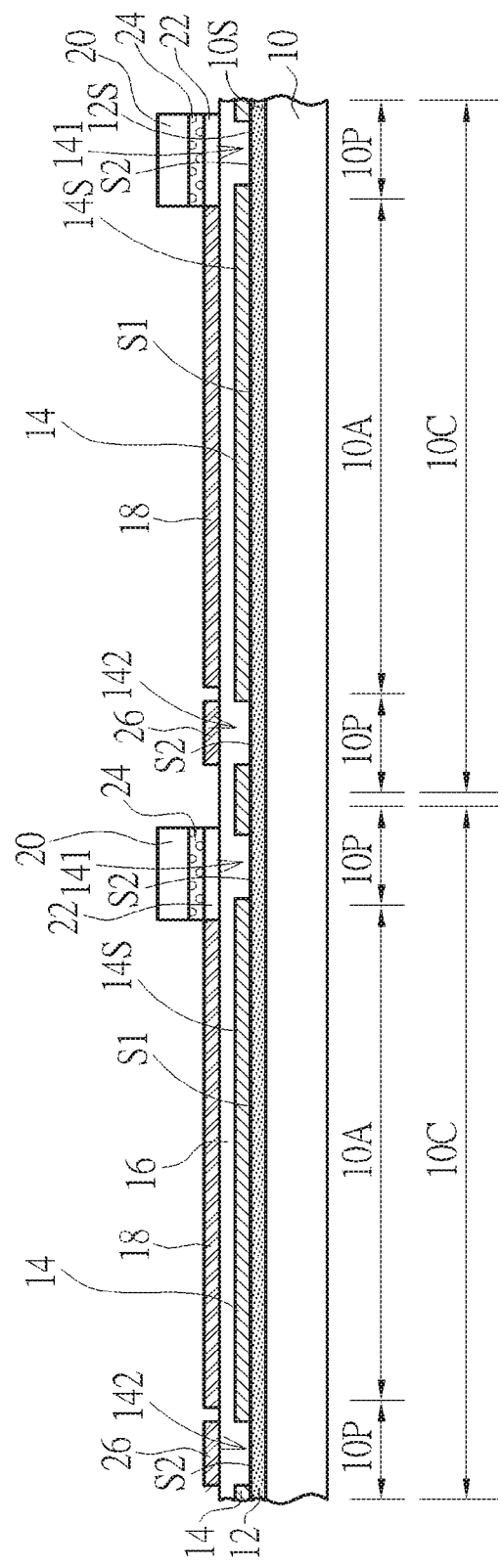
Figure 7:
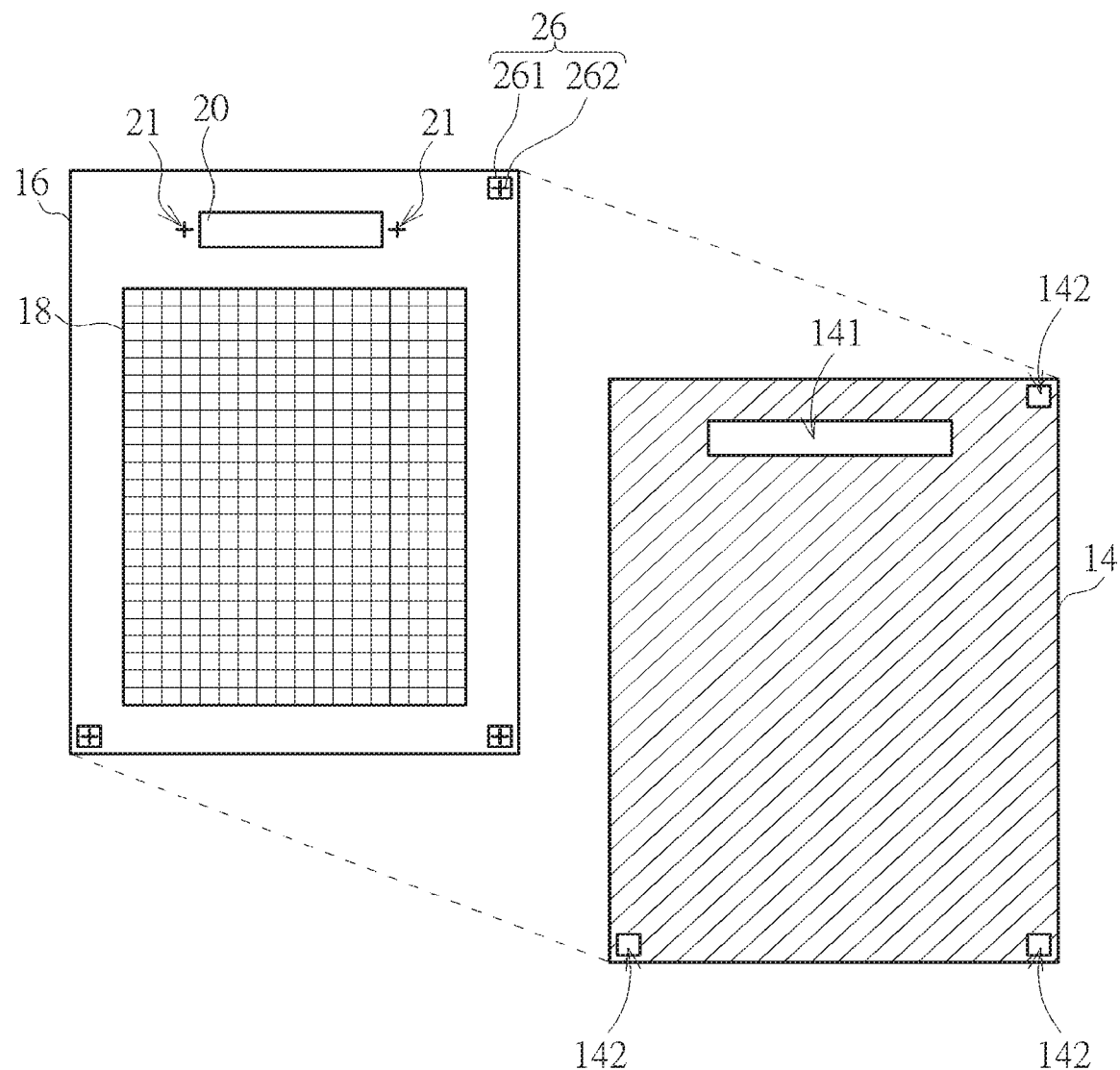

Refer to FIGS. 1-9. FIGS. 1-9 are schematic diagram illustrating a method of fabricating flexible display panel according to an embodiment of the present invention, where FIG. 1 is a top view, FIG. 7 is an exploded view, and FIGS. 2-6 and 8-9 are cross-sectional views. As shown in FIG. 1 and FIG. 2, a carrier substrate 10 is provided. The carrier substrate 10 is a rigid substrate (namely a firm substrate or a hard substrate) e.g. a glass substrate, a quartz substrate, a silicon substrate or another substrate with sufficient structural strength. The carrier substrate 10 is preferably light-transmissive for the sake of alignment during process. The carrier substrate 10 has a plurality of chip panel regions 10C, each chip panel region 10C has an active region 10A and a peripheral region 10P, and each peripheral region 10P surrounds the corresponding active region 10A. In this embodiment, the method of fabricating flexible display panel is a batch process, i.e. a plurality of flexible display panels are formed simultaneously formed and separated subsequently. In the description, each chip panel region is used to form a flexible display panel. In FIG. 2, the cross-sectional structures of two chip panel regions are exemplarily drawn.

Figure 3:
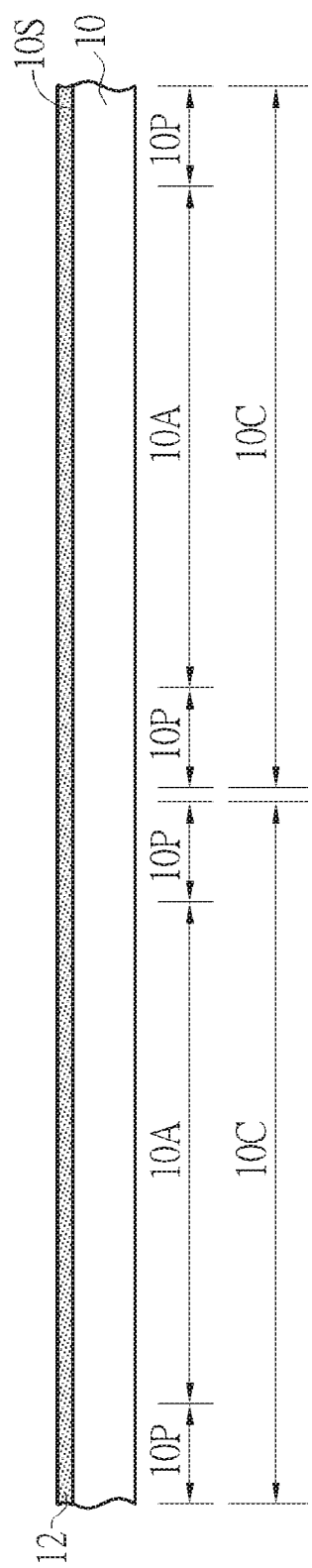

As shown in FIG. 3, a first organic layer 12 is formed on a surfaced 10S of the carrier substrate 10. In this embodiment, the step of forming the first organic layer 12 may include performing a modification process on the surface 10S of the carrier substrate 10. When a glass substrate is selected as the carrier substrate 10, a coupling agent comprising fluoroalkyl may be used to form a fluoroalkyl group derivative on the surface 10S of the carrier substrate 10 as the first organic layer 12. For example, if a coupling agent comprising fluoroalkyl and silane used, the material of the first organic layer 12 is fluoroalkylsilane (FAS). In this embodiment, the chemical formula of fluoroalkylsilane (FAS) may be, for example, $Si(OMe)_3C_nF_{2n+1}$, where n is an integer greater than or equal to 1, Si represents silicon atom, O represents oxygen atom, Me represents methyl, C represents carbon atom and F represents fluorine atom. In an alternative embodiment, some of the fluorine atoms may be replaced by hydrogen atoms. In such a case, the chemical formula of fluoroalkylsilane (FAS) may be, for example, $Si(OMe)_3C_nH_{2m}F_{2n-2m+1}$, where n is an integer greater than or equal to 2, m is an integer less than n, Si represents silicon atom, O represents oxygen atom, Me represents methyl, C represents carbon atom, H represents hydrogen atom and F represents fluorine atom. In other alternative embodiments, other types of coupling agents may be used to perform the modification process, or other process and material may be used to form the first organic layer 12. For example, the material of the first organic layer 12 may include parylene, silane, siloxane, fluoroalkylsilane (FAS) or a combination thereof, and the first organic layer 12 may be formed by various types of physical processes such as physical deposition process (e.g. sputtering) or chemical processes (e.g. chemical vapor deposition).

Figure 4:
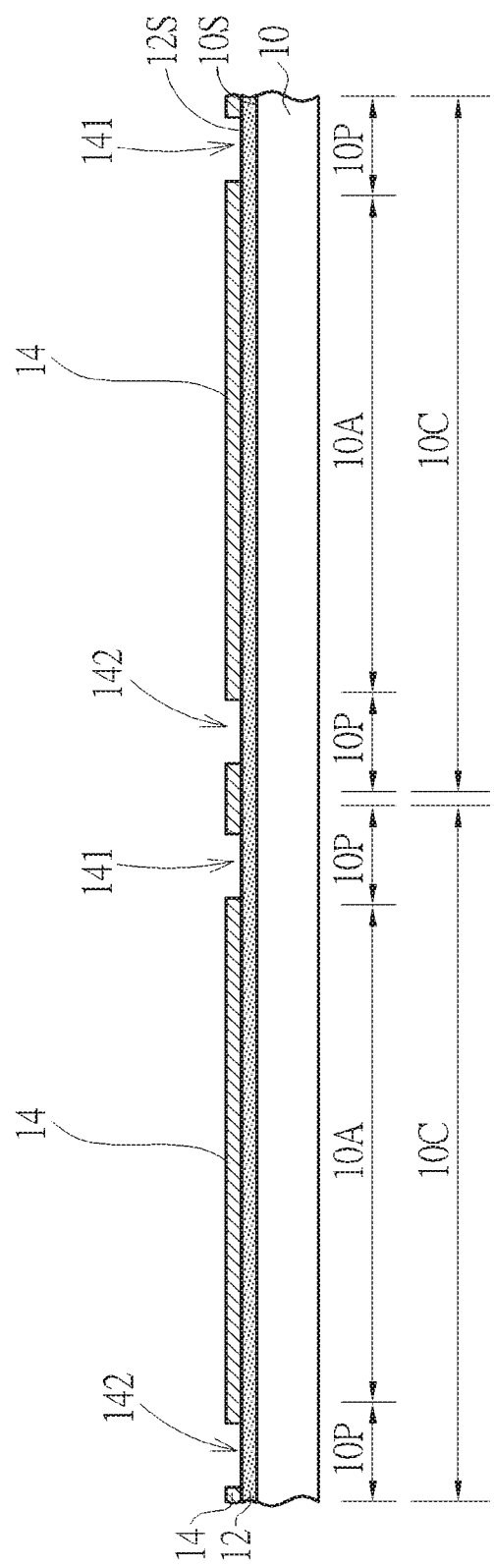

As shown in FIG. 4, a release layer 14 is formed on the surface 12S of the first organic layer 12. The release layer 14 has a plurality of first openings 141, and each of the first openings 141 exposes a portion of the surface 12S of the first organic layer 12 in the peripheral region 10P of the corresponding chip panel region 10C. In this embodiment, the thickness of the release layer 14 is, for example, substantially between about 0.001 micrometers and 1 micrometer, but not limited thereto. The material of the release layer 14 may be inorganic material, which may include metal, metal compound or a combination thereof. The metal for the release layer 14 may include gold (Au), silver (Ag), platinum (Pt), copper (Cu), titanium (Ti), aluminum (Al), chromium (Cr), lead (Pb), rhodium (Rh), molybdenum (Mo), tungsten (W), zinc (Zn), tin (Sn) or a combination thereof. The metal compound for the release layer 14 may include metal oxide, metal nitride or a combination thereof, and the metal contained in the metal compound may be the aforementioned metal material or other suitable metal materials. For example, the metal compound may include indium oxide ($In_2O_3$), tin oxide ($SnO_2$), zinc oxide (ZnO), cadmium oxide (CdO), titanium nitride (TiN), indium tin oxide (ITO), indium zinc oxide (IZO), gallium zinc oxide (GZO), aluminum zinc oxide (AZO), fluorine-doped tin oxide ($SnO_2$:F), tantalum-doped titanium oxide ($TiO_2$:Ta), cadmium indium oxide ($CdIn_2O_4$), cadmium tin oxide ($Cd_2SnO_4$), zinc tin oxide ($Zn_2SnO_4$) or a combination thereof. The release layer 14 may be formed on the first organic layer 12 by various types of physical process such as physical vapor deposition or chemical process such as chemical vapor deposition. For example, the release layer 14 may be formed by a sputter process, but not limited thereto. In addition, the release layer 14 may be flexible. In this embodiment, the release layer 14 may further have a plurality of second openings 142. The location of the second openings 142 are corresponding to alignments marks to be formed, and the second openings 142 enables to perform an alignment process from the backside of the carrier substrate 10.

As shown in FIG. 5, a second organic layer 16 is formed on the surface 14S of the release layer 14. In this embodiment, the material of the second organic layer 16 may include polyimide (PI), polycarbonate (PC), polyethersulfone (PES), polynorbornene (PNB), polyetheramide (PEI), poly(p-phenylene benzobisimidazole) (PBI), poly(p-phenylene benzobisoxazole) (PBO), poly(p-phenylene terephthalamide) (PPTA), poly(ethylene terephthalate) (PET), poly(ethylene naphthalate) (PEN) or a combination thereof, but not limited thereto. The second organic layer 16 may be flexible. The release layer 14 is in physical contact with the surface 12S of the first organic layer 12 to form a first interface S1, the second organic layer 16 is in physical contact with a portion of the surface 12S of the first organic layer 12 through the first openings 141 of the release layer 14 to form a second interface S2, and the debonding force of the first interface S1 is greater than the debonding force of the second interface S2. In the present invention, the release layer 14 is used as a temporary adhesive layer during process to temporarily bond the flexible display panel to the carrier substrate 10. The release layer 14 will be removed from the surface 12S of the first organic layer 12 and the carrier substrate 10 in successive process to form the flexible display panel. In this embodiment, by virtue of the first openings 141 of the release layer 14, the first organic layer 12 would have two interfaces of different debonding forces. Specifically, the first interface S1 between the release layer 14 and the surface 12S of the first organic layer 12 have a stronger debonding force, which provides stronger adhesion force to firmly adhere the flexible display panel to the first organic layer 12; the second interface S2 between the second organic layer 16 and the surface 12S of the first organic layer 12 exposed by the first openings 141 of the release layer 14 have a weaker debonding force, which provides weaker adhesion force to prevent the flexible display panel from being damaged during releasing process. In this embodiment, the ratio of the debonding force of the first interface S1 to the debonding force of the second interface S2 is between about 1 and 20, but not limited thereto. For example, the debonding force of the first interface S1 is about 5 gf/in, and the debonding force of the second interface S2 is about 2 gf/in, but not limited thereto and may be modified.

As shown in FIG. 6 and FIG. 7, a plurality of display device arrays 18 are formed on the second organic layer 16, where each display device array 18 is formed in the active region 10A of the corresponding chip panel region 10C. In this embodiment, each of the display device arrays 18 includes a plurality of display devices corresponding to a plurality of sub-pixel regions (not shown) of the corresponding active region 10A. The display device array 18 may be various types of display device array e.g. electroluminescent display device array, electrophoretic display device array, electrowetting display device array, liquid crystal display device array or other suitable display device array. The display device array 18 may further include switching devices, driving devices, display medium, capacitor devices and other devices for providing display function. A plurality of driving ICs (integrated circuits) 20 are formed on the second organic layer 16. The driving ICs 20 are electrically connected to the display device arrays 18, and the driving ICs are corresponding to the first openings 141 of the release layer 14, respectively. Prior to forming the driving ICs 20, conductive lines 22 may be formed on the second organic layer 16. The conductive lines 22 are electrically connected to the display device arrays 18, and the conductive lines 22 and any one of the conductive layers may be formed by the same patterned conductive layer, but not limited thereto. In this embodiment, the driving ICs 20 are electrically connected to the display device arrays 18 through the conductive lines 22, and the driving ICs 20 may be mounted on and electrically connected to the conductive lines 22 by a conductive adhesion layer 24 (e.g. anisotropic conductive film, ACF). In addition, driving IC alignment marks 21 (as shown in FIG. 7) may be optionally formed on the second organic layer 16. In this embodiment, the driving IC alignment marks 21 can be observed from the backside of the carrier substrate 10 through the first openings 141 of the release layer 14 when the driving ICs 20 and the conductive lines 22 are adhered, and thus the driving ICs 20 can be accurately aligned. In addition, the compression condition of the conductive adhesion layer 24 can be confirmed through the first openings 141 of the release layer 14 from the backside of the carrier substrate 10 as well. A plurality of alignment marks 26 may also be optionally formed on the second organic layer 16, where the alignment marks 26 are corresponding to the second openings 142 of the release layer 14 respectively. As shown in FIG. 7, the alignment marks 26 may include a first alignment mark 261 and a second alignment mark 262. The first alignment mark 261 and the second alignment mark 262 are formed by different patterned layers, which may be the patterned layers of the display device array 18 respectively. For example, the first alignment mark 261 and the first patterned conductive layer (e.g. the first metal layer) may be formed simultaneously, and the second alignment mark 262 and the second patterned conductive layer (e.g. the second metal layer) may be formed simultaneously. The first alignment mark 261 and the second alignment mark 262 can be observed from the backside of the carrier substrate 10 through the second openings 142 of the release layer 14, and thus the first patterned conductive layer and the second patterned conductive layer of the display device array 18 can be accurately aligned. In addition, the alignment marks 26 may also be used in successive cutting process.

Figure 8:
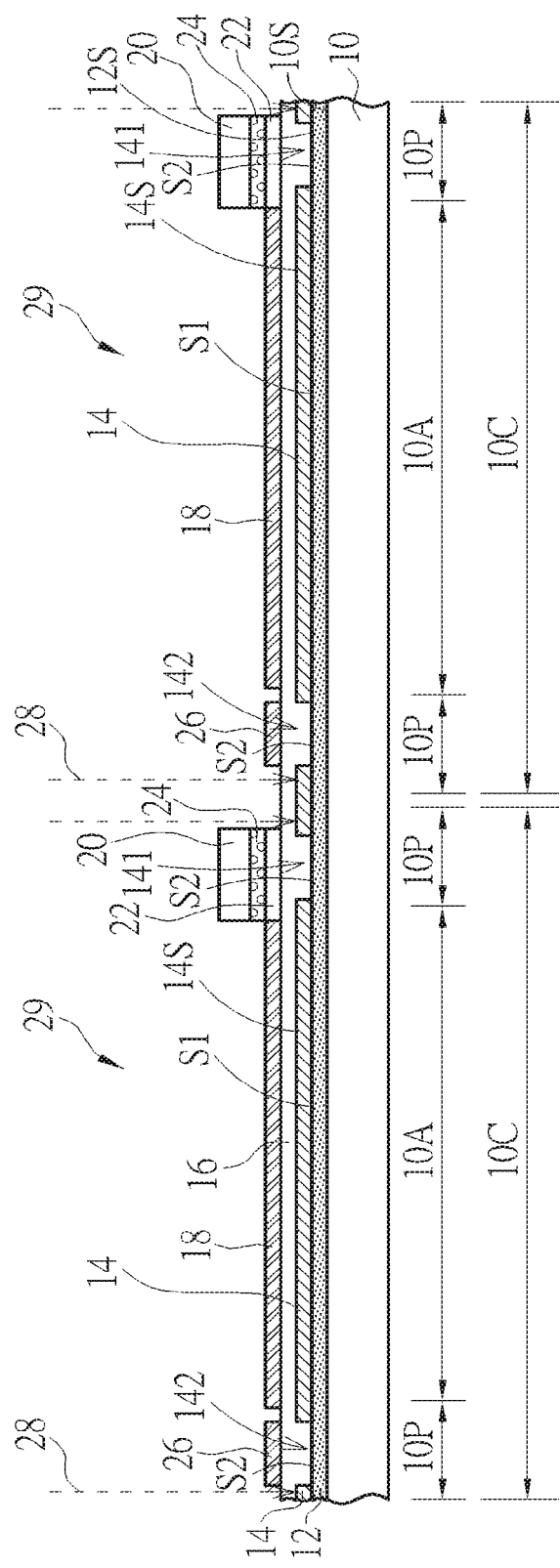

As shown in FIG. 8, a cutting process is performed to cut the second organic layer 16 and the release layer 14 along the cutting line 28 in the peripheral region 10P of each chip panel region 10C to separate the second organic layer 16 and the release layer 14 of each chip panel region 10C from the second organic layer 16 and the release layer 14 of other adjacent chip panel regions 10C; meanwhile, the second organic layer 16 and the release layer 14 are still adhered to the surface 12S of the first organic layer 12. A display panel structure 29 is formed by the aforementioned processes. The display panel structure 29 is an intermediate product of the flexible display panel, in which the release layer 14, the second organic layer 16, the display device array 18, the conductive lines 22, the conductive adhesion layer 24 and the driving IC 20 that constitute the flexible display panel are not departed from the first organic layer 12 and the carrier substrate 10. Thus, the display panel structure 29 is stilled supported and protected by the carrier substrate 10.

Figure 9:
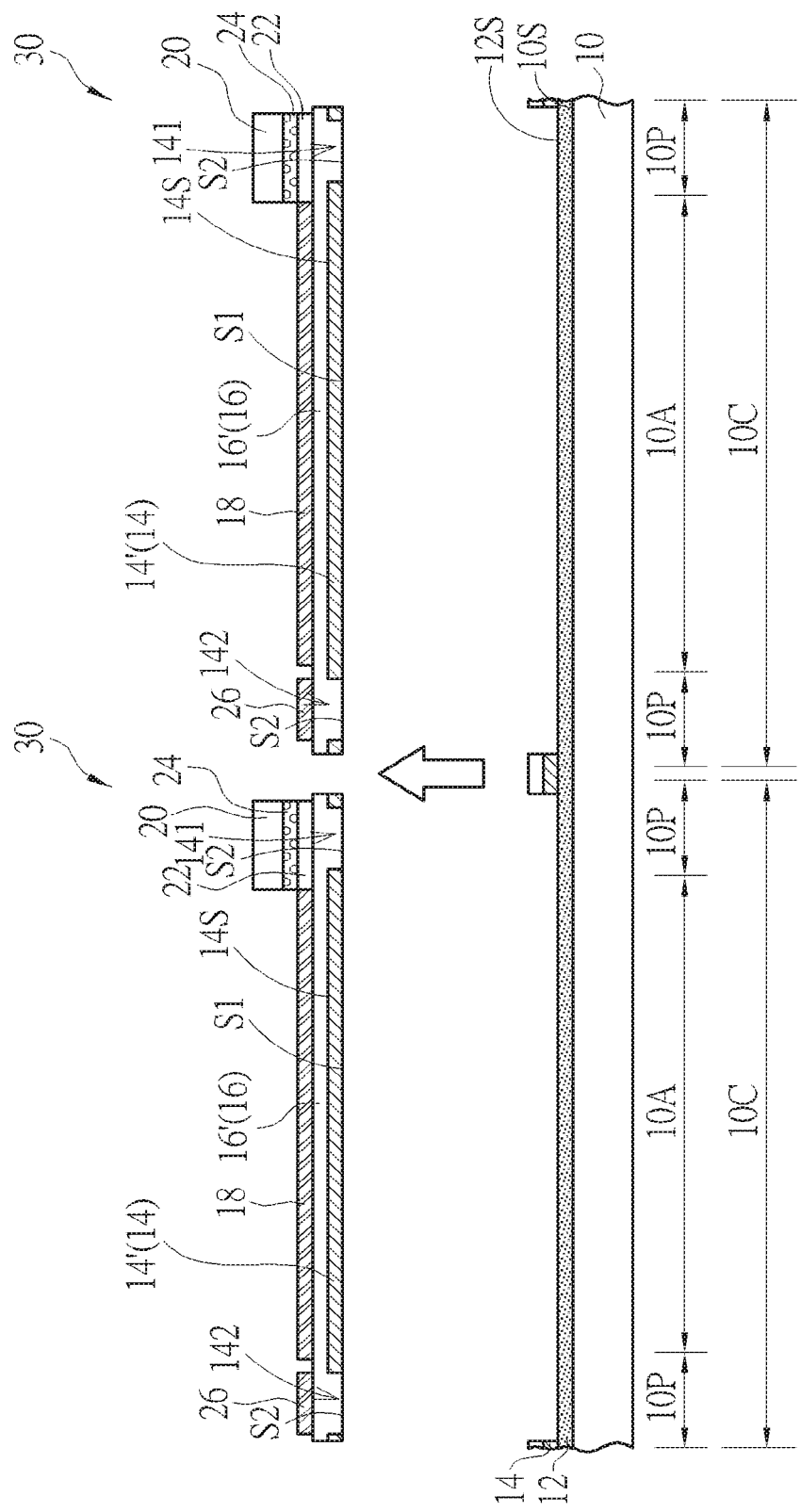

As shown in FIG. 9, the release layer 14 and the second organic layer 16 in the chip panel regions 10C is separated from the surface 12S of the first organic layer 12 to form a plurality of flexible display panel 30. Each of the flexible display panels 30 includes a barrier layer 14', a flexible layer 16', a display device array 18 and a driving IC 20. The barrier layer 14' is formed after the release layer 14 is departed from the first organic layer 12, and thus the material and characteristic of the barrier layer 14' are identical to that of the release layer 14, which are not redundantly described. The flexible layer 16' is formed after the second organic layer 16 is departed from the first organic layer 12, and thus the material and characteristic of the flexible layer 16' are identical to that of the second organic layer 16, which are not redundantly described. It is noted that when forming the driving IC 20, the location of the second organic layer 16 corresponding to the first opening 141 is pressed, and thus stress is generated between the second organic layer 16 and the first organic layer 12 exposed by the first opening 141. However, since the original debonding force of the second interface S2 between the second organic layer 16 and the first organic layer 12 exposed by the first opening 141 is weaker, the increase of adhesion in this region due to the compression of the driving IC 20 or due to the high temperature when forming the display device array 18 would not cause trouble departing the second organic layer 16 from the first organic layer 12. As a result, the flexible layer 16' can be formed without damaging the driving IC 20 and the conductive line 22. In this embodiment, the release layer 14 is reserved on the bottom surface of the second organic layer 16 and served as the barrier layer 14' after the releasing process. Since the barrier layer 14' includes conductive material such as metal or metal compound, electrostatic discharge (ESD) will not be generated during the releasing process, which prevents the display device array 18 and the driving IC 20 from being damaged by ESD. In addition, the barrier layer 14' is resistant to water and oxygen, and thus the lifetime of the flexible display panel 30 is increased as the degradation of OLED material of the display device array 18 due to the exposure to moisture is prevented.

Figure 10:
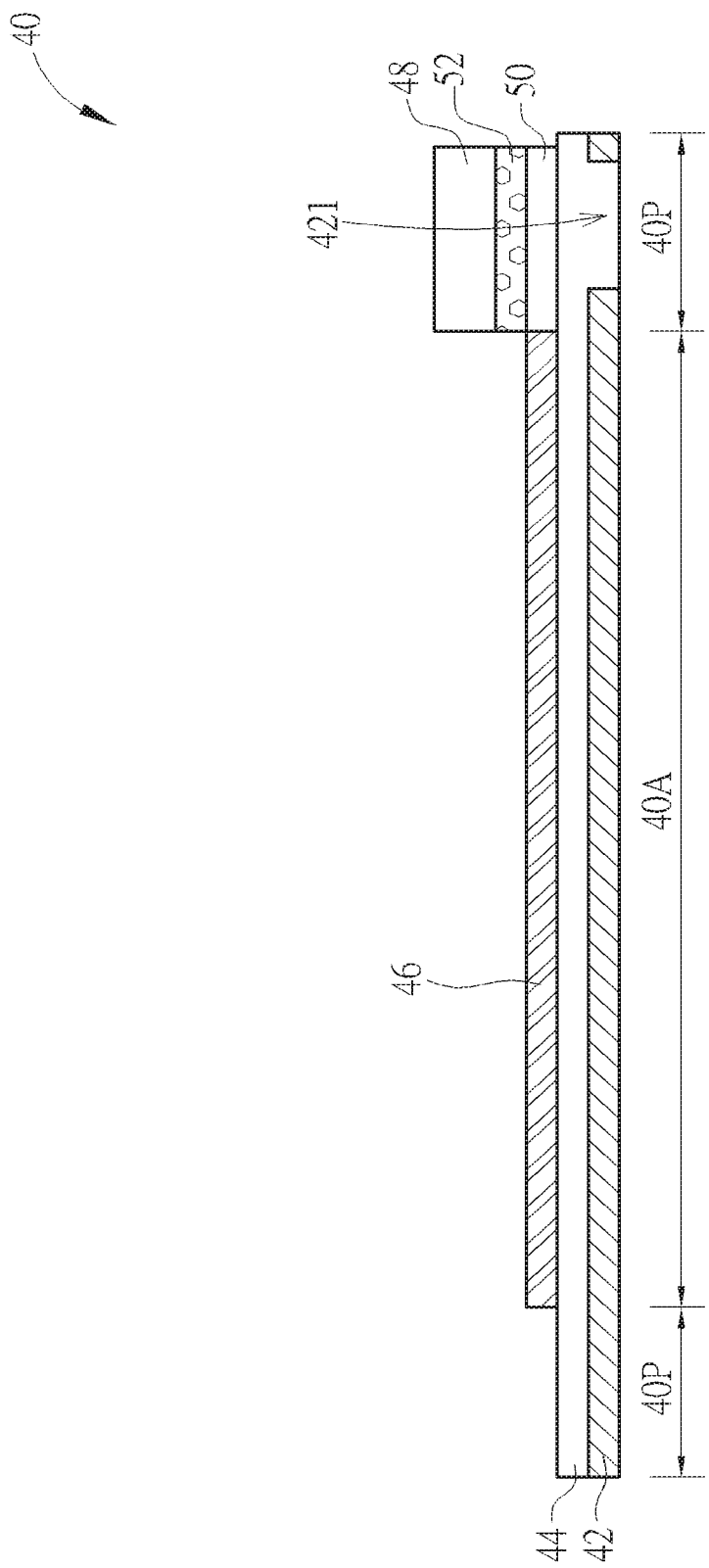
FIG. 10 is a schematic diagram illustrating a flexible display panel according to a first embodiment of the present invention.

Refer to FIG. 10. FIG. 10 is a schematic diagram illustrating a flexible display panel according to a first embodiment of the present invention. As shown in FIG. 10, the flexible display panel 40 has an active region 40A and a peripheral region 40P surrounding the active region 40A. The flexible display panel 40 includes a barrier layer 42, a flexible layer 44, a display device array 46 and a driving IC 48. The barrier layer 42 has a first opening 421. The barrier layer 42 is flexible, and the material and characteristic of the barrier layer 42 are described in the aforementioned embodiment. The flexible layer 44 is disposed on the barrier layer 42 and in contact with the barrier layer 42 and filled into the first opening 421 of the barrier layer 42. The flexible layer 44 is flexible, and the material and characteristic of the flexible layer 44 are described in the aforementioned embodiment. The display device array 46 is disposed on a surface of the flexible layer 44 and located in the active region 40A. The choice of the display device array 46 is described in the aforementioned embodiment. The driving IC 48 is disposed on the surface of the flexible layer 44, electrically connected to the display device array 46 and corresponding to the first opening 421 of the barrier layer 42. The driving IC 48 may be electrically connected the display device array 46 through a conductive line 50, and the driving IC 48 may be mounted on and electrically connected to the conductive line 50 by a conductive adhesion layer 52 (e.g. anisotropic conductive film, ACF).

Figure 11:
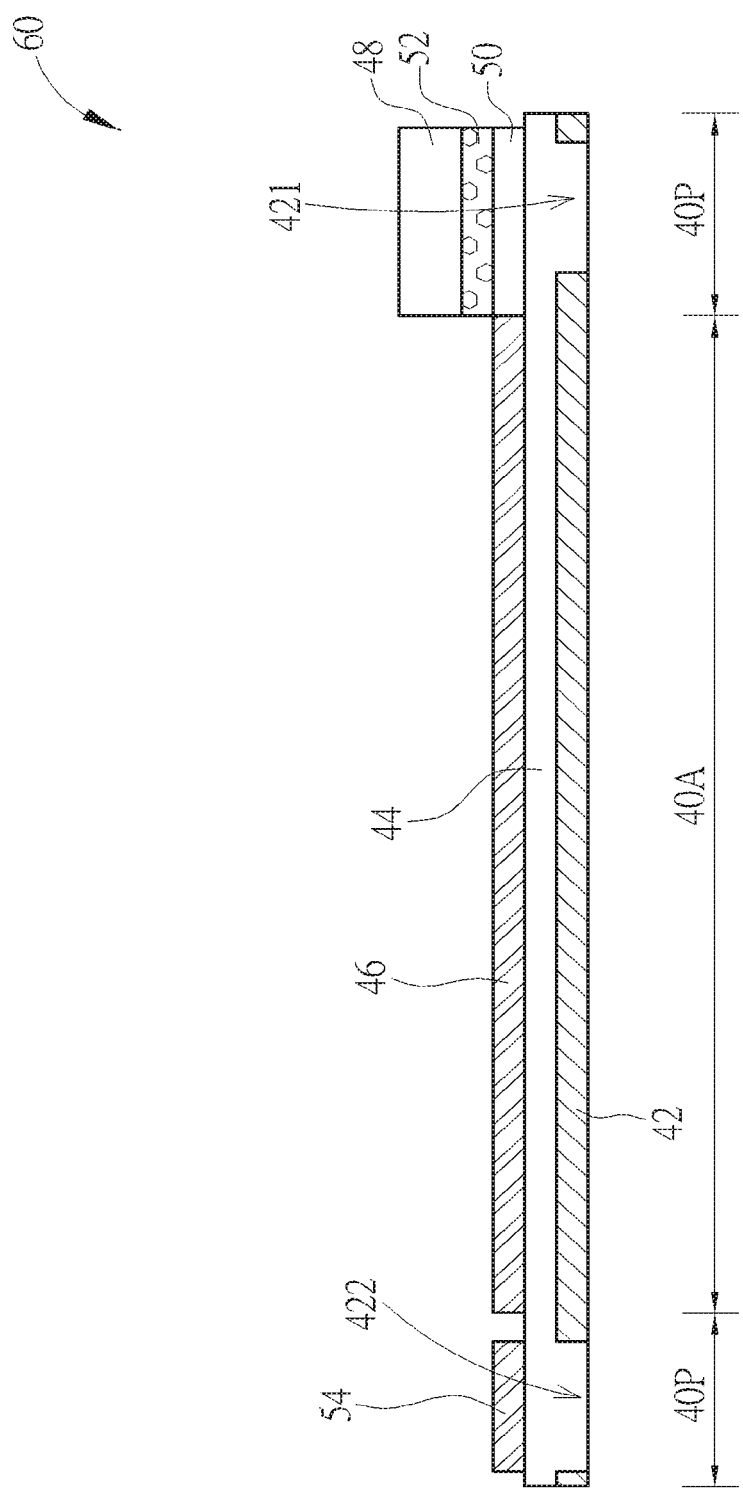
FIG. 11 is a schematic diagram illustrating a flexible display panel according to a second embodiment of the present invention.

Refer to FIG. 11. FIG. 11 is a schematic diagram illustrating a flexible display panel according to a second embodiment of the present invention. As shown in FIG. 11, different from the first embodiment, the flexible display panel 60 of the second embodiment further includes at least one alignment mark 54 disposed on the surface of the flexible layer 44. The barrier layer 42 further has at least one second opening 422, and the alignment mark 54 is corresponding to the second opening 422 of the barrier layer 42. The alignment mark 54 is configured to provide aligning function during process, and the second opening 422 of the barrier layer 42 makes it possible to observe the alignment mark 54 from the backside of the barrier layer 42.

In conclusion, the flexible display panel and the fabrication method thereof create a plurality of regions with different debonding forces, which provides sufficient adhesion between the flexible display panel and the carrier substrate and also prevents the driving IC and the conductive line from being damaged due to excessive debonding force. In addition, the barrier layer (the release layer) of the flexible display panel includes conductive material e.g. metal, which avoids generation of ESD during the releasing process, and thus the display device array and the driving IC are free from ESD damage. Furthermore, the barrier layer (the release layer) is water and oxygen resistant, which increases the lifetime of the flexible display panel. Also, the opening of the barrier layer (the release layer) makes it possible to observe the alignment mark from the backside of the barrier layer (the release layer), and thus the alignment accuracy is increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a flexible display panel, comprising:
   providing a carrier substrate, wherein the carrier substrate has at least one chip panel region, the at least one chip panel region has an active region and a peripheral region, and the peripheral region surrounds the active region;
   forming a first organic layer on a surface of the carrier substrate;
   forming a release layer on a surface of the first organic layer, wherein the release layer has at least one first opening, and the at least one first opening exposes a portion of the surface of the first organic layer in the peripheral region of the at least one chip panel region;
   forming a second organic layer on a surface of the release layer, wherein the release layer and the first organic layer have a first interface, the second organic layer and the portion of the surface of the first organic layer exposed by the at least one first opening of the release layer have a second interface, and a debonding force of the first interface is greater than a debonding force of the second interface;
   forming at least one display device array on the second organic layer, wherein the at least one display device array is disposed in the active region of the at least one chip panel region; and
   performing a cutting process to cut the second organic layer and the release layer in the peripheral region of the at least one chip panel region to separate the second organic layer and the release layer in the at least one chip panel region from the surface of the first organic layer to form at least one flexible display panel;
   wherein the cutting process is performed to cut the second organic layer and the release layer along a cutting line outside the at least one first opening.

2. The method of fabricating the flexible display panel of claim 1, wherein the carrier substrate comprises a glass substrate.

3. The method of fabricating the flexible display panel of claim 2, wherein forming the first organic layer comprises performing a modification process on the surface of the carrier substrate.

4. The method of fabricating the flexible display panel of claim 1, wherein a material of the first organic layer comprises a fluoroalkyl group derivative.

5. The method of fabricating the flexible display panel of claim 4, wherein a material of the first organic layer comprises fluoroalkylsilane (FAS).

6. The method of fabricating the flexible display panel of claim 1, wherein a material of the release layer comprises a metal, a metal compound or a combination thereof.

7. The method of fabricating the flexible display panel of claim 6, wherein the metal of the release layer comprises gold (Au), silver (Ag), platinum (Pt), copper (Cu), titanium (Ti), aluminum (Al), chromium (Cr), lead (Pb), rhodium (Rh), molybdenum (Mo), tungsten (W), zinc (Zn), tin (Sn) or a combination thereof.

8. The method of fabricating the flexible display panel of claim 6, wherein the metal of the release layer comprises metal oxide, metal nitride or a combination thereof.

9. The method of fabricating the flexible display panel of claim 1, wherein a material of the second organic layer comprises polyimide (PI), polycarbonate (PC), polyethersulfone (PES), polynorbornene (PNB), polyetheramide (PEI), poly(p-phenylene benzobisimidazole) (PBI), poly(p-phenylene benzobisoxazole) (PBO), poly(p-phenylene terephthalamide) (PPTA), poly(ethylene terephthalate) (PET), poly(ethylene naphthalate) (PEN), or a combination thereof.

10. The method of fabricating the flexible display panel of claim 1, further comprising forming at least one driving IC on the second organic layer prior to performing the cutting process, wherein the at least one driving IC is electrically connected to the at least one display device array, and the at least one driving IC corresponds to the at least one first opening of the release layer.

11. The method of fabricating the flexible display panel of claim 1, further comprising forming an alignment mark on the second organic layer, wherein the release layer further has at least one second opening, and the alignment mark corresponds to the at least one second opening of the release layer.

12. The method of fabricating the flexible display panel of claim 1, wherein a part of the second organic layer is filled into the at least one first opening.

13. A method of fabricating a flexible display panel, comprising:
    providing a carrier substrate, wherein the carrier substrate has at least one chip panel region, the at least one chip panel region has an active region and a peripheral region, and the peripheral region surrounds the active region;
    forming a first organic layer on a surface of the carrier substrate;
    forming a release layer on a surface of the first organic layer, wherein the release layer has at least one first opening, and the at least one first opening exposes a portion of the surface of the first organic layer in the peripheral region of the at least one chip panel region;
    forming a second organic layer on a surface of the release layer, wherein a part of the second organic layer is filled into the at least one first opening;

forming at least one display device array on the second organic layer, wherein the at least one display device array is disposed in the active region of the at least one chip panel region; and performing a cutting process along a cutting line outside the at least one first opening to cut the second organic layer and the release layer in the peripheral region of the at least one chip panel region so as to separate the second organic layer and the release layer from the surface of the first organic layer to form at least one flexible display panel, wherein the at least one first opening is disposed between the at least one display device array and the cutting line.

14. The method of fabricating the flexible display panel of claim 13, wherein the carrier substrate comprises a glass substrate.

15. The method of fabricating the flexible display panel of claim 13, wherein a material of the first organic layer comprises a fluoroalkyl group derivative.

16. The method of fabricating the flexible display panel of claim 13, wherein a material of the release layer comprises a metal, a metal compound or a combination thereof.

17. The method of fabricating the flexible display panel of claim 13, wherein a material of the second organic layer comprises polyimide (PI), polycarbonate (PC), polyethersulfone (PES), polynorbornene (PNB), polyetheramide (PEI), poly(p-phenylene benzobisimidazole) (PBI), poly(p-phenylene benzobisoxazole) (PBO), poly(p-phenylene terephthalamide) (PPTA), poly(ethylene terephthalate) (PET), poly(ethylene naphthalate) (PEN), or a combination thereof.

18. The method of fabricating the flexible display panel of claim 13, further comprising forming at least one driving IC on the second organic layer prior to performing the cutting process, wherein the at least one driving IC is electrically connected to the at least one display device array, and the at least one driving IC is aligned over the at least one first opening of the release layer.

19. The method of fabricating the flexible display panel of claim 13, further comprising forming an alignment mark on the second organic layer, wherein the release layer further has at least one second opening, and the alignment mark corresponds to the at least one second opening of the release layer.

* * * * *